(12) United States Patent
Estrada

(10) Patent No.: US 9,692,411 B2
(45) Date of Patent: Jun. 27, 2017

(54) INTEGRATED LEVEL SENSING PRINTED CIRCUIT BOARD

(75) Inventor: Jesus Estrada, Gloucester, MA (US)

(73) Assignee: FLOW CONTROL LLC, Beverly, MA (US)

(*) Notice: Subject to any disclaimer, the term of this patent is extended or adjusted under 35 U.S.C. 154(b) by 538 days.

(21) Appl. No.: 13/107,584

(22) Filed: May 13, 2011

(65) Prior Publication Data

US 2012/0290227 A1    Nov. 15, 2012

(51) Int. Cl.
*H03K 17/96*    (2006.01)
*G01F 23/26*    (2006.01)

(52) U.S. Cl.
CPC ......... *H03K 17/962* (2013.01); *G01F 23/266* (2013.01)

(58) Field of Classification Search
CPC ............................ G01F 23/266; H03K 17/962
USPC ........ 702/55, 52; 73/290 R, 304 C; 324/696, 324/691
See application file for complete search history.

(56) References Cited

U.S. PATENT DOCUMENTS

| | | | |
|---|---|---|---|
| 4,382,382 A | 5/1983 | Wang | |
| 5,017,909 A | 5/1991 | Goekler | |
| 5,083,470 A * | 1/1992 | Davis et al. | ................ 73/864.24 |
| 5,097,703 A | 3/1992 | Peter | |
| 5,145,323 A | 9/1992 | Farr | |
| 5,153,572 A | 10/1992 | Caldwell et al. | |
| 5,245,873 A * | 9/1993 | Fathauer et al. | ............ 73/304 C |
| 5,287,086 A | 2/1994 | Gibb | |
| 5,315,884 A | 5/1994 | Kronberg | |
| 5,376,948 A | 12/1994 | Roberts | |
| 5,508,719 A | 4/1996 | Gervais | |
| 5,532,527 A | 7/1996 | Zatler et al. | |
| 5,562,498 A | 10/1996 | Brandenburg et al. | |
| 5,600,997 A * | 2/1997 | Kemp et al. | ................. 73/290 V |
| 5,613,399 A * | 3/1997 | Hannan | ................. G01F 23/265 702/55 |

(Continued)

FOREIGN PATENT DOCUMENTS

| | | |
|---|---|---|
| CN | 101435836 | 5/2009 |
| EP | 1256902 | 11/2002 |

(Continued)

OTHER PUBLICATIONS 1 page EP 1256902 Abstract—English Language Translation, Nov. 13, 2002.
CN101435836 English Abstract (2 pages).

*Primary Examiner* — Ricky Ngon
(74) *Attorney, Agent, or Firm* — Ware, Fressola, Maguire & Barber LLP

(57) ABSTRACT

A level sensing circuit board featuring at least one processor and at least one memory including computer program code, where the at least one memory and computer program code are configured, with the at least one processor, to cause the apparatus at least to: respond to a signal containing information related to the electrical conductivity of a material causing a stimulus to a sensing plate that corresponds to a positive plate of a capacitor directly connected to an input of a comparator that forms part of a variable frequency oscillator; and determine a proportional response containing information about the material causing the stimulus to the sensing plate based at least partly on the signal received. The level sensing circuit may be used as a means to turn a pump on or off based on a sensed fluid level.

30 Claims, 4 Drawing Sheets

(56) References Cited

U.S. PATENT DOCUMENTS

| | | |
|---|---|---|
| 5,765,434 A | 6/1998 | Harbaugh |
| 5,796,183 A | 8/1998 | Hourmand |
| 5,844,506 A | 12/1998 | Binstead |
| 5,854,625 A | 12/1998 | Frisch et al. |
| 5,943,044 A | 8/1999 | Martinelli et al. |
| 5,973,415 A * | 10/1999 | Brenner et al. .............. 307/118 |
| 5,995,084 A | 11/1999 | Chan et al. |
| 6,138,508 A | 10/2000 | Hannan et al. |
| 6,310,611 B1 | 10/2001 | Caldwell |
| 6,320,282 B1 | 11/2001 | Caldwell |
| 6,713,897 B2 | 3/2004 | Caldwell |
| 6,897,390 B2 | 5/2005 | Caldwell et al. |
| 6,933,800 B2 | 8/2005 | Wallace, Jr. et al. |
| 6,944,018 B2 | 9/2005 | Caldwell |
| 7,017,409 B2 | 3/2006 | Zielinski et al. |
| 7,023,215 B2 | 4/2006 | Steenwyk |
| 7,026,861 B2 | 4/2006 | Steenwyk |
| 7,030,513 B2 | 4/2006 | Caldwell |
| 7,098,414 B2 | 8/2006 | Caldwell |
| 7,150,190 B2 * | 12/2006 | Krufka et al. .............. 73/304 C |
| 7,175,304 B2 | 2/2007 | Wadia et al. |
| 7,218,498 B2 | 5/2007 | Caldwell |
| 7,242,393 B2 | 7/2007 | Caldwell |
| 7,258,005 B2 | 8/2007 | Nyce |
| 7,260,438 B2 | 8/2007 | Caldwell et al. |
| 7,291,939 B2 | 11/2007 | Hoekstra |
| 7,361,860 B2 | 4/2008 | Caldwell |
| 7,364,322 B2 | 4/2008 | Oppor et al. |
| 7,373,817 B2 | 5/2008 | Burdi et al. |
| 7,602,384 B2 | 10/2009 | Rosenberg et al. |
| 7,633,301 B2 | 12/2009 | Steenwyk et al. |
| 7,692,933 B1 | 4/2010 | Mueller et al. |
| 7,733,332 B2 | 6/2010 | Steenwyk et al. |
| 7,733,333 B2 | 6/2010 | Kaliher |
| 7,840,286 B2 | 11/2010 | Caldwell et al. |
| 7,850,339 B2 | 12/2010 | Wadia et al. |
| 7,851,719 B2 | 12/2010 | Dzioba |
| 2003/0028346 A1 | 2/2003 | Sinclair et al. |
| 2006/0146036 A1 | 7/2006 | Prados et al. |
| 2007/0205995 A1 | 9/2007 | Woolley |
| 2009/0080139 A1 | 3/2009 | Yu |
| 2009/0158841 A1* | 6/2009 | Winkens .............. G01F 23/266 73/304 C |
| 2010/0045612 A1 | 2/2010 | Molne |
| 2010/0123686 A1 | 5/2010 | Klinghult et al. |
| 2010/0268490 A1 | 10/2010 | Chang |
| 2010/0302177 A1 | 12/2010 | Kim et al. |
| 2011/0050591 A1 | 3/2011 | Kim et al. |
| 2011/0050618 A1 | 3/2011 | Murphy et al. |
| 2011/0063248 A1 | 3/2011 | Yoon |

FOREIGN PATENT DOCUMENTS

| | | |
|---|---|---|
| EP | 1744132 | 1/2007 |
| EP | 2133777 | 12/2009 |
| GB | 2321707 | 5/1998 |
| WO | 9306572 | 4/1993 |
| WO | 9638833 | 12/1996 |
| WO | 2011025845 | 3/2011 |

* cited by examiner

Apparatus 10, including a level sensing circuit board 18,

Signal processing module 20

At least one processor 22

— 20b

At least one memory 24 including computer program code, the at least one memory 24 and computer program code being configured, with at least one processor 22, to cause the signal processing module 20 at least to:

respond to a signal containing information related to the electrical conductivity of a material causing a stimulus to a sensing plate that corresponds to a positive plate of a capacitor directly connected to an input of a comparator that forms part of a variable frequency oscillator; and determine a proportional response containing information about the material causing the stimulus to the sensing plate based at least partly on the signal received — 20a Other level sensing circuit board components or circuits 26, including a sensing plate and a circuit for sensing a signal containing information related to the electrical conductivity of a material causing a stimulus to a sensing plate

*FIG. 1a*

Apparatus, including a pump 16,

Level sensing circuit board 18

Other pump components 16a

*FIG. 1b*

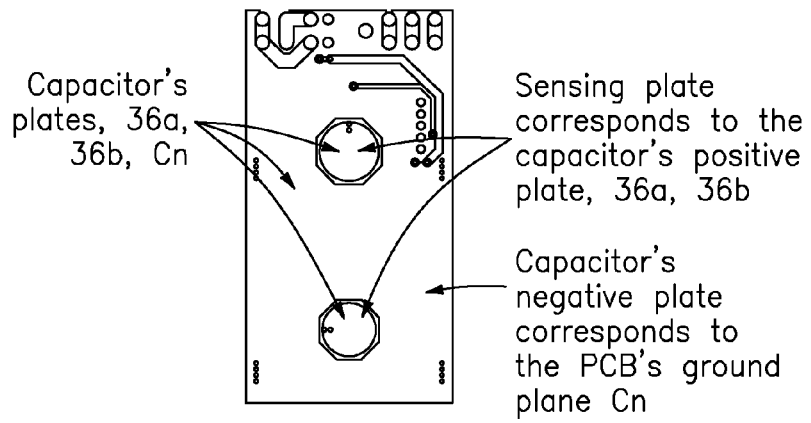
*FIG. 2*: PCB's bottom side view
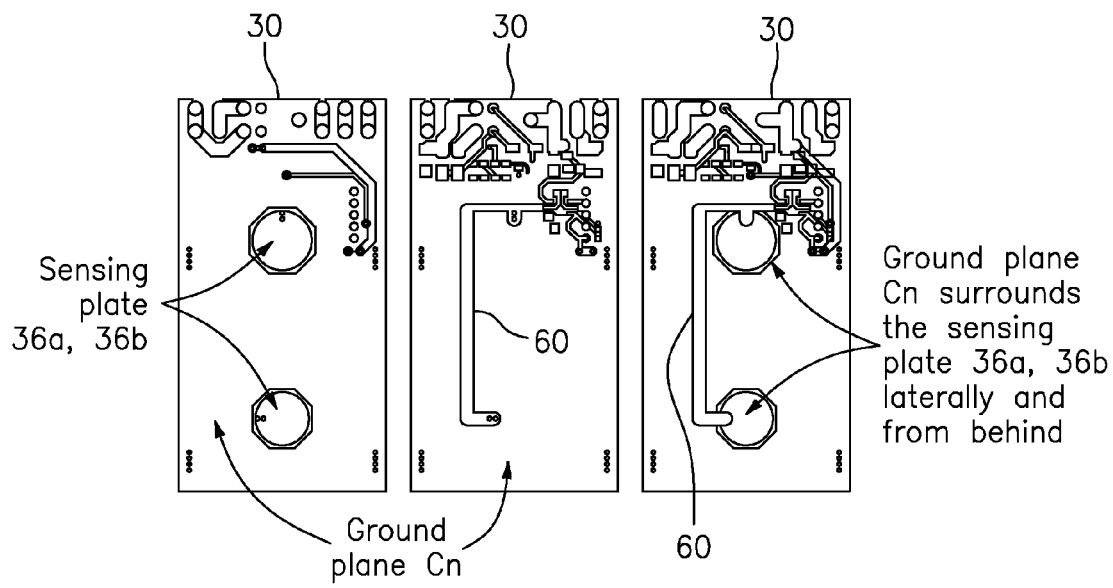
*FIG. 3a*  Bottom Side View
*FIG. 3b*  Top Side View
*FIG. 3c*  Overlapping View
*FIG. 3*

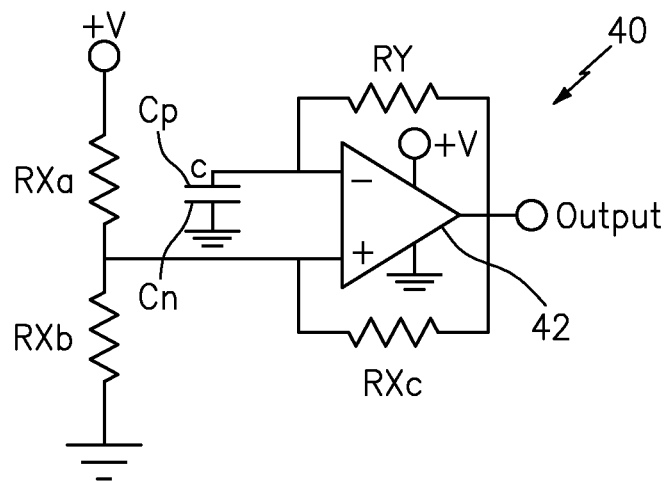
*FIG. 4* (Variable Oscillator Frequency)
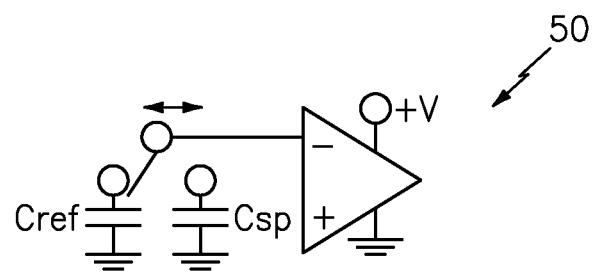
*FIG. 5* (Temperature Compensation Circuit)

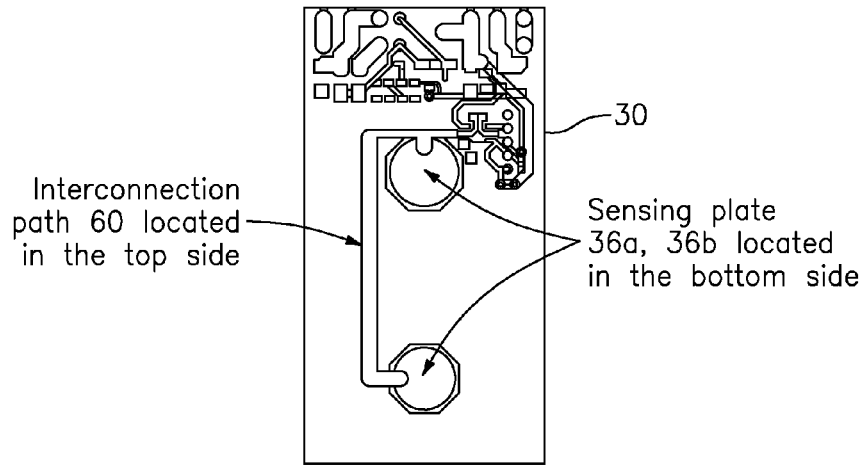
FIG. 6 (Overlapping View of Printed Circuit Board)
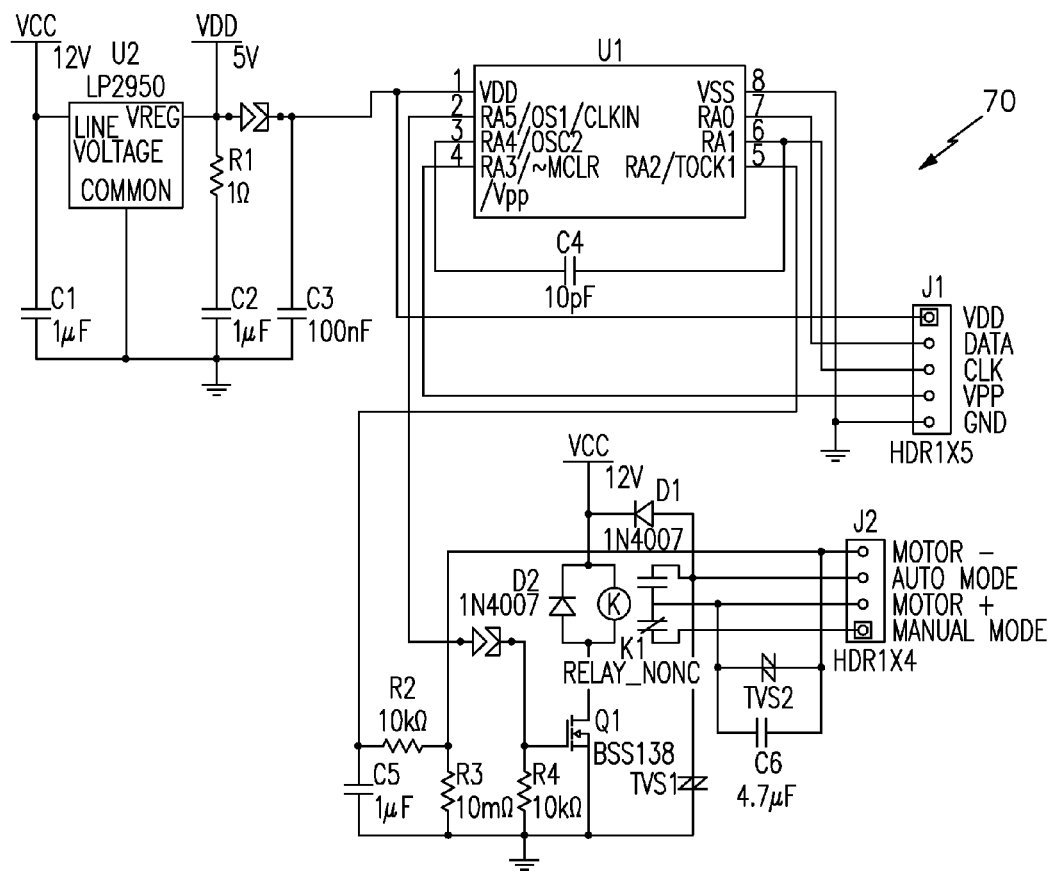
FIG. 7

INTEGRATED LEVEL SENSING PRINTED CIRCUIT BOARD

BACKGROUND OF THE INVENTION

1. Field of the Invention

This invention relates to a circuit for controlling the operation of a device based at least partly on sensing a fluid level; and more particularly, relates to a circuit board for controlling a pump based at least partly on sensing a fluid level.

2. Description of Related Art

Touch sensitive technology is known in the art and available in the marketplace. For example, one company, known as Touch Sensor, provides touch sensitive technology that is based at least partly on using an application specific integrated circuit (ASIC) device. For a particular application, the ASIC device and related components are required for each TouchCell™, which is basically a sensing pad that detects if a person's finger, or an aqueous solution, or a conductive mass is touching the dielectric substrate to which the TouchCell™ is attached behind. Each TouchCell™ has only two possible output states—"activated" and "not activated." Based on a present understanding, it seems that the output state depends on a threshold at the input, once the input is over or under that threshold the output state will reflect it. Moreover, Touch Sensor's product is focused on the ASIC and related hardware; they describe their product as "a software free, solid-state switch." The design and manufacturing are done by Touch Sensor based on costumer specifications.

In comparison, another company, know as Atmel, provides touch sensitive technology that is based on using a software library that can be downloaded into their microcontrollers and performs the tasks related to the processing of the signals from the sensing pads, so there is proprietary hardware involved. However, Atmel's product seems to be more flexible, from the user's point of view, because the user can buy Atmel's microcontrollers, download the software library and proceed to design and manufacture the hardware. Each sensing pad has only two states associated to it, "activated" and "not activated", just like the Touch sensor's product.

Some disadvantages of the known prior art products include the following:

1) Any developed application is tied to proprietary hardware/software.

2) There is not intermediate or proportional responses from the sensing pads. Because of the second disadvantage, multiple sensing pads and microcontroller inputs are required to perform level detection; so the cost increases with the number of sensing pads; no distinction can be made between different types of materials; and only electrically conductive materials can be detected.

3) At least one microcontroller input is required for each sensing pad.

4) There are some location restrictions regarding the separation between the supporting hardware and the sensing pads.

Moreover, U.S. Pat. No. 5,153,572 discloses touch sensitive technology that includes a touch control circuit having an oscillator with a positive plate of a capacitor connected to an inverting input of a comparator, and includes resistors configured in relation to the inverting input, the non-inverting input and the output of the comparator, for providing a square wave output. A touch panel has on/off touch pads arranged in relation to pads and coupled to a connector. The square wave output is provided from the connector to the pads. In operation, the on/off touch pads are contacted in order to make a selection. The on/off touch pads are not directly connected to the positive plate of the capacitor which is directly connected to the inverting input of the comparator of the oscillator; instead, the square wave signal is coupled to the on/off touch pads via the connector, the pads, an adhesive and a glass element. Further, the touch-sensitive control circuit for touch pads also has a coincidence detector responding to simultaneous change of impedance of two or more different touch pads using logic circuits.

SUMMARY OF THE INVENTION

According to some embodiments, the invention may take the form of apparatus, such as a level sensing circuit board, comprising: at least one processor and at least one memory including computer program code, where the at least one memory and computer program code are configured, with the at least one processor, to cause the apparatus at least to:

respond to a signal containing information related to the electrical conductivity of a material causing a stimulus to a sensing plate that corresponds to a positive plate of a capacitor directly connected to an input (e.g. an inverting input) of a comparator that forms part of a variable frequency oscillator; and determine a proportional response containing information about the material causing the stimulus to the sensing plate based at least partly on the signal received.

According to some embodiments of the present invention, the level sensing circuit may be used as a means to turn a device, equipment or apparatus, including a pump, on or off based on a sensed fluid level, and may also form part of the device, equipment or apparatus, including the pump, e.g., as a circuit board component.

According to some embodiments of the present invention, the signal may contain information about a frequency variation that is proportional to the electrical conductivity of the material placed in front of the sensing plate, how much of the sensing plate's surface the material is facing, and/or the distance between the material and the sensing plate.

According to some embodiments of the present invention, the proportional response may contain information about at least one of the following:

the type of material in the proximity of the sensing plate; or the distance between the material and sensing plate; or the size of the material's surface facing the sensing plate.

According to some embodiments of the present invention, the ground plane may be configured to surround the sensing plate laterally and from behind to act as a barrier that nullifies the response from the sensing plate and cause the sensing plate to detect objects placed in front of it.

According to some embodiments of the present invention, the at least one memory and computer program code may be configured to, with the at least one processor, cause the apparatus at least to do one or more of the following: to implement multiple sensing plates based at least partly on one input; or to distinguish between material types, so as to determine if the material is water or a part of a person in contact with the sensing plate; or to detect a non-conductive material, including plastic; or to provide an output signal containing information about the proportional response, including for turning on a device, equipment or apparatus, including a pump, based on a fluid level; or to determine the proportional response based at least partly on a change in a relationship between a value of a capacitor and the frequency of an oscillator, where the sensing plate corresponds to a positive plate of the capacitor, and the capacitor is coupled to a comparator that forms part of the oscillator; or to count pulses produced by an oscillator during a constant time interval or time base, so the proximity of any material to the sensing plate is reflected as a reduction in the pulses counted so as to detect a material.

According to some embodiments of the present invention, the capacitor may be built using conductive strokes on a printed circuit board, having the variable frequency oscillator and a microcontroller that includes the at least one memory and computer program code and the at least one processor. The variable frequency oscillator may include a comparator, e.g., that is directly connected to an inverting input and ground. The output of the comparator and the inverting input are connected through a resistor (RY); the non-inverting input is connected through three resistors, all having substantially the same value (RXa, RXb, RXc), to power (+V), ground and the comparator's output; and the comparator output is used as feedback for both inputs. In operation, the comparator may be configured to do the following: When the comparator output is high, it generates a current that charges the capacitor connected to the inverting input and a reference voltage applied to the non-inverting input, the value of the reference voltage is higher than the capacitor's voltage when the comparator's output changes from low to high, as a result, the comparator output remains high until the capacitor voltage reaches the reference voltage, at which point the comparator output changes from high to low; the low state generates a current that discharges the capacitor connected to the inverting input and a different value for the reference voltage applied to the non-inverting input, the value of the reference voltage is lower than the capacitor's voltage when the comparator's output changes from high to low, as a result, the comparator's output remains low until the capacitor's voltage reaches the reference voltage, then the comparator's output changes from low to high and the cycle starts again.

According to some embodiments of the present invention, the negative plate of the capacitor corresponds to a ground plane of the printed circuit board.

According to some embodiments of the present invention, the at least one memory and computer program code may be configured to, with the at least one processor, cause the apparatus at least to detect the distance between the sensing plate and the material based at least partly on the fact that, if the type of material doesn't change, and the amount of sensing plate's surface facing the material remains substantially constant, then the frequency variation of a variable frequency oscillator coupled to the sensing plate will be inversely proportional to the distance between the material and the sensing plate.

According to some embodiments of the present invention, the at least one memory and computer program code may be configured to, with the at least one processor, cause the apparatus at least to detect a fluid level and the size of a flat object facing the sensor plate based at least partly on the fact that, if the type of material doesn't change, and the distance between the material and the sensing plate remains substantially constant, then the frequency variation in a variable frequency oscillator coupled to the sensing plate is directly proportional to the amount of sensing plate's surface facing the material.

According to some embodiments of the present invention, the at least one memory and computer program code may be configured to, with the at least one processor, cause the apparatus at least to detect different types of materials based at least partly on the fact that, if the distance between the material and the sensing plate remains substantially constant as well as the amount of sensing plate's surface facing the material, then the frequency change of a variable frequency oscillator coupled to the sensing plate will be directly proportional to the electrical conductivity of the material.

According to some embodiments of the present invention, the sensing plate may be segmented into several discrete surfaces, each one with a well defined contribution to the net capacitance value but all them interconnected in a different printed circuit board layer, so that only one sensing plate can act as multiple virtual sensor surfaces, and so that the sensing plate need not be located on the same printed circuit board as the at least one memory, the at least one processor, and the oscillator.

According to some embodiments, the level sensing circuit board may comprise a sensing plate in combination with a signal processing module. By way of example, and consistent with that described above, the sensing plate corresponds to the positive plate of the capacitor directly connected to the inverting input of the comparator that forms part of the variable frequency oscillator; and the signal processing module has the at least one processor and the at least one memory including the computer program code.

The present invention provides a significant improvement over the known prior art technology. Some advantages of the invention include the following:

1) The described invention can be implemented with generic components, so there is not proprietary hardware/software involved.

2) The described invention has a proportional response to the stimulus, in other words, the output signal is proportional to the following:

Type of material in the proximity to the sensing plate (also called sensing pad).

Distance between the material and the sensing plate.

Size the material's surface facing the sensing plate.

Because of the second advantage, with one microcontroller input multiple sensing pads can be implemented; no multiple hardware resources are required to perform level detection; so the cost of implementation is lower; and a distinction can be made between materials types, so the system can determine if it is water or a person's finger what is in contact with the sensing plate.

Because of the second advantage, non conductive materials (like plastic) can be detected.

3) There are no location restrictions.

These and other features, aspects, and advantages of embodiments of the invention will become apparent with reference to the following description in conjunction with the accompanying drawing. It is to be understood, however, that the drawing is designed solely for the purposes of illustration and not as a definition of the limits of the invention.

BRIEF DESCRIPTION OF THE DRAWING

The drawing, which is not necessarily to scale, include the following Figures:

FIG. 1 includes FIGS. 1a and 1b, where FIG. 1a shows a block diagram of apparatus, including a level sensing circuit board, according to some embodiments of the present invention, and where FIG. 1b shows block diagram of apparatus, including a pump having the level sensing circuit board, according to some embodiments of the present invention.

FIG. 2 shows a bottom side view of a printed circuit board according to some embodiments of the present invention.

FIG. 3 includes FIGS. 3a, 3b, 3c, where FIG. 3a is a bottom side view of a printed circuit board according to some embodiments of the present invention; where FIG. 3b is a top side view of a printed circuit board according to some embodiments of the present invention; and where FIG. 3c is an overlapping view of a printed circuit board according to some embodiments of the present invention.

FIG. 4 shows a diagram of an oscillator according to some embodiments of the present invention.

FIG. 5 shows a diagram of a temperature compensation circuit according to some embodiments of the present invention.

FIG. 6 shows an overlapping view of a printed circuit board according to some embodiments of the present invention.

FIG. 7 shows a circuit diagram of a printed circuit board according to some embodiments of the present invention.

In the following description of the exemplary embodiment, reference is made to the accompanying drawing, which form a part hereof, and in which is shown by way of illustration of an embodiment in which the invention may be practiced. It is to be understood that other embodiments may be utilized, as structural and operational changes may be made without departing from the scope of the present invention.

DETAILED DESCRIPTION OF THE INVENTION

The Basic Invention

FIG. 1a shows one example apparatus generally indicated as 10 according to some embodiments, which may also take the form of a level sensing circuit board 18 that forms part of a device, equipment or apparatus, such as a pump 16 shown in FIG. 1b, or which may also take the form of the pump 16 itself shown in FIG. 1b having the level sensing circuit board 18 as a basic component thereof. The invention is described by way of example in relation to a pump like element 16, although the scope of the invention is intended to include other types or kinds of device, equipment or apparatus either now known or later developed in the future. In FIG. 1a, the apparatus 10 includes a signal processing module 20 for implementing the signal processing functionality according to the present invention associated with the level sensing circuit board 18, and also includes other components or circuits 26 described in more detail below, both coupled together by a signal path 20a. In FIG. 1b, the pump 16 may includes the level sensing circuit board 18 as a printed circuit board component thereof in combination with other pump components 16a that do not form part of the underlying invention and are not described in detail herein.

FIGS. 2, 3 and 6 show a printed circuit board generally indicated as 30 for implementing the functionality of the present invention, which includes sensing plates 36a, 36b and a ground plate 34 as shown.

FIG. 4 shows a variable frequency oscillator generally indicated as 40 having a comparator 42 with an inverting input (−), a non-inverting input (+) and an output; a capacitor C having a positive plate Cp and a negative plate Cn; and resistors RXa, RXb, RXc and RY.

In FIGS. 2, 3 and 6, the sensing plate 36a, 36b corresponds to the capacitor's positive plate Cp shown in FIG. 4 and the ground plate 34 corresponds to the capacitor's negative plate Cn shown in FIG. 4. In FIGS. 2, 3 and 6, the ground plate 34 surrounds the sensing plate 36a, 36b laterally and from behind as shown.

Referring back to FIG. 1a, the signal processing module 20 includes at least one processor 22 and at least one memory 24 including computer program code coupled together by a signal path 20b. In operation, the at least one memory 24 and computer program code are configured, with the at least one processor 22, to cause the apparatus 10 at least to do the following:

respond to a signal containing information related to the electrical conductivity of a material causing a stimulus to the sensing plate 36a, 36b that corresponds to the positive plate Cp of the capacitor C directly connected to an input, e.g., the inverting input (−), of the comparator C that forms part of the variable frequency oscillator 40; and determine a proportional response containing information about the material causing the stimulus to the sensing plate 36a, 36b based at least partly on the signal received.

The material may take the form of a fluid such as water, and in operation the level sensing circuit 18 may be used as a means to turn the pump 16 on or off based on a sensed fluid level, according to some embodiments of the present invention. The signal would be received either directly or indirectly from the output of the comparator 42.

According to some embodiments, the present invention may be described by way of example with the sensing capacitor forming part of a printed circuit board. However, embodiments are also envisioned, and the scope of the invention is also intended to include, the sensing capacitor being a stand alone capacitor coupled directly or indirectly to a printed circuit board consistent with that described herein, including that described in relation to the embodiment featuring the reference capacitor Cref set forth herein. Embodiments are also envisioned, and the scope of the invention is also intended to include, the sensing capacitor and printed circuit board having other types or kinds of configurations either now known or later developed in the future.

Implementation of the Functionality of the Circuit Board or Signal Processing Module 20

The functionality of the signal processing module 20 may be implemented using hardware, software, firmware, or a combination thereof, although the scope of the invention is not intended to be limited to any particular embodiment thereof. In a typical software implementation, the signal processing module 20 may take the form of one or more microprocessor-based architectures having a processor or microprocessor like element 22, a random access memory (RAM), a read only memory (ROM), the RAM and ROM together forming at least part of the memory like element 24, input/output devices and control, data and address buses connecting the same. A person skilled in the art would be able to program such a microprocessor-based implementation with computer program code to perform the functionality described herein without undue experimentation. The scope of the invention is not intended to be limited to any particular implementation using technology either now known or later developed in the future. Moreover, the scope of the invention is intended to include the signal processing module 20 being a stand alone module, or in some combination with other circuitry for implementing another module. Moreover still, the scope of the invention is not intended to be limited to any particular type or kind of signal processor used to perform the signal processing functionality, or the manner in which the computer program code is programmed or implemented in order to make the signal processor operate.

The signal processing module 20 may include one or more other sub-modules for implementing other functionality that is known in the art, but does not form part of the underlying invention per se, and is not described in detail herein. For example, the functionality of the one or more other modules may include the techniques for the provisioning of the signal for activating or deactivating the pump based on certain processing control functionality, including providing the signal automatically, providing the signal after a certain time period, etc., that can depend on a particular application for a particular customer.

DETAILED DESCRIPTION OF THE INVENTION

In concept, the main parts of the system are a capacitor built using the conductive strokes on the printed circuit board 30 as shown in FIGS. 2, 3 and 6, the variable frequency oscillator 40 (FIG. 4) and a microcontroller like the signal processor module 20 (see FIG. 1a).

The oscillator 40 may include the comparator 42 as can be seen in FIG. 4. The capacitor C is directly connected to the inverting input (−) and ground, the output and the inverting input (−) are connected through the resistor (RY); the non-inverting input (+) is connected through three resistors, e.g., all them of the same value (RXa, RXb, RXc), to input power (+V), ground and the comparator's output. The comparator output is used as feedback for both inputs (−, +) of the comparator 42. In operation, when the comparator output is high, it generates a current that charges the capacitor C connected to the inverting input (−) and a reference voltage is applied to the non-inverting input (+), the value of the reference voltage is higher than the capacitor's voltage when the comparator's output changes from low to high, as a result, the comparator output remains high until the capacitor voltage reaches the reference voltage, at which point the comparator output changes from high to low. The low state generates a current that discharges the capacitor connected to the inverting input (−) and a different value for the reference voltage is applied to the non-inverting input (+), the value of the reference voltage is lower than the capacitor's voltage when the comparator's output changes from high to low, as a result, the comparator's output remains low until the capacitor's voltage reaches the reference voltage, then the comparator's output changes from low to high and the cycle starts again.

As shown in FIG. 2, the negative plate Cn of the capacitor C comprises the ground plane layout on the printed circuit board 30 (FIGS. 2, 3 and 6); the positive plate Cp is used as the sensing plate 36a, 36b, and therefore the shape of the conductive strokes and its location on the printed circuit board 30 depends on the particular application. As a critical and distinctive design characteristic the ground plane is used as a barrier that nullifies the sensing plate response; in the case of the board 30 shown in FIGS. 2, 3 and 6, the ground plane 34 surrounds the sensing plate 36a, 36b laterally and from behind; as a result, the sensing plate 36a, 36b will be able to detect the objects placed in front of it only.

If any material is placed in front of the sensing plate 36a, 36b, the resulting effect is that the net value of the capacitor C seen from the inverting input (−) increases, so the frequency of the oscillator 40 decreases. The increase in capacitance C and decrease in frequency is proportional to (1) the electrical conductivity of the material placed in front of the sensing plate, (2) how much of the sensing plate's surface the material is facing, and (3) the distance between the material and the sensing plate.

The microcontroller like element 20 counts the pulses produced by the oscillator 40 during a constant time interval or time base, so the proximity of any material to the sensing plate 36a, 36b is reflected as a reduction in the pulses counted by the microcontroller 20, and this is why the material can actually be detected.

Oscillator's Stability in Relation to Supply Voltage Changes

Whereas the output voltage has a tolerance and a variation range, it is desired that the oscillator's frequency be independent of voltage. To this end, the circuit shown in FIG. 4 can be used. A person skilled in the art would appreciate that the oscillator's frequency is substantially independent of the supply voltage.

System's Stability Relative to Temperature Changes

FIG. 5 shows a temperature compensation circuit or arrangement generally indicated as 50 that includes a comparator 52 and a reference capacitor Cref that can be used in conjunction with the oscillator 40. FIG. 5 also shows a capacitor labeled Csp, which corresponds to the sensing plate 36a, 36b. As a person skilled in the art would appreciate, the oscillator's frequency and microcontroller's internal clock frequency are inevitably affected by temperature variations. This can cause false detections in the overall system. To resolve this problem, according to the present invention, the inverting input (−) of the oscillator 40 is multiplexed in order to establish a reference oscillation frequency, see FIG. 5; for the duration of a constant time interval or time base, the non-inverting input is connected to a reference capacitance, Cref, which because of it's location on the board is not affected by physical proximity of materials, the microcontroller, e.g., element 20 (FIG. 1a), counts the pulses produced by the oscillator using the reference capacitance Cref and stores this information in memory; for the next constant time interval or time base, the reference capacitance Cref is disconnected from the non-inverting input and the sensing plate, Csp, is connected instead; then the microcontroller counts the pulses produced by the oscillator using the sensing plate and store's this information in memory. Since the same oscillator and the same microcontroller are used to generate and count the pulses for reference and detection, the frequency shift due to temperature variation keeps the same proportion in both readings; thus the ratio of the pulses generated from the detection plate with respect to the pulses generated from reference capacitance remains substantially constant and unaffected by temperature variations. The proximity of a material modifies the capacitance of the sensing plate only, in this case, the ratio of the pulses generated from the sensing plate with respect to the pulses generated from the reference capacitance does change, it is this change what indicates the proximity of a material to the sensing plate.

Discrimination Against the Distance

According to some embodiments of the present invention, discrimination against distance is possible. For example, if the type of material doesn't change, and the amount of sensing plate's surface facing the material remains substantially constant, then the frequency variation will be inversely proportional to the distance between the material and the sensing plate 36a, 36b. This response can be used in an application to detect distance.

If the type of material doesn't change, and the distance between the material and the sensing plate 36a, 36b remains substantially constant, then the frequency variation is directly proportional to the amount of sensing plate's surface facing the material. This response can be used in an application for detecting fluid level and the size of a flat object facing the sensor plate 36a, 36b.

If the distance between the material and the sensing plate 36a, 36b remains substantially constant as well as the amount of sensing plate's surface facing the material, then the frequency change will be directly proportional to the electrical conductivity of the material. This response can be used in an application to detect different types of materials.

The sensing plate 36a, 36b may have any shape and may also be segmented into several discrete surfaces, each one with a well defined contribution to the net capacitance value but all of them interconnected in a different printed circuit board layer. This feature provides this design another distinctive characteristic; it is possible to have only one sensing plate 36a, 36b acting as multiple virtual sensor surfaces. Moreover, the sensing plate 36a, 36b need not be located on the same printed circuit board as the microcontroller and the oscillator. In the case of the board shown in FIG. 6, the two rounded shapes from which the sensing plate 36a, 36b is formed are interconnected by an interconnection path 60 on the opposite side of the printed circuit board as shown.

FIG. 7: Sample Circuit

FIG. 7 shows, by way of example, circuitry 70 for implementing the functionality according to the present invention consistent with that described herein, including a voltage circuit arrangement having an adjustable micropower regulator U2 (LP2950), an oscillator arrangement having a comparator U1 coupled to the voltage circuit arrangement and a connector J1, and a motor control circuit arrangement coupled to the oscillator arrangement and a connector J2 for turning the motor of the pump on/off based at least partly on the fluid level sensed.

Scope of the Invention

Although described in the context of particular embodiments, it will be apparent to those skilled in the art that a number of modifications and various changes to these teachings may occur. Thus, while the invention has been particularly shown and described with respect to one or more preferred embodiments thereof, it will be understood by those skilled in the art that certain modifications or changes, in form and shape, may be made therein without departing from the scope and spirit of the invention as set forth above.

I claim:

1. A level sensing printed circuit board, comprising:
   a sensing capacitor having a sensing plate and a negative plate, the sensing plate being a positive plate and configured to sense the electrical conductivity of a material causing a stimulus and provide positive plate signaling containing information about the electrical conductivity sensed, and the negative plate corresponding to a ground plane of the level sensing printed circuit board;
   a variable frequency oscillator having a comparator with an input configured to respond to the positive plate signaling, and provide variable frequency oscillator signaling containing information about variable frequency oscillations based upon the positive plate signaling sensed; and
   a signal processing module configured at least to:
      respond to the variable frequency oscillator signaling, and
      determine a corresponding signal containing information about a proportional frequency response caused by the stimulus and sensed by the sensing plate, based at least partly on the variable frequency oscillator signaling received.

2. A level sensing printed circuit board according to claim 1, wherein the variable frequency oscillator signaling received contains information about a frequency variation that is proportional to the electrical conductivity of the material placed in front of the sensing plate, how much of the sensing plate's surface the material is facing, and the distance between the material and the sensing plate.

3. A level sensing printed circuit board according to claim 1, wherein the proportional frequency response contains information about at least one of the following:
   the type of material in the proximity of the sensing plate; or
   the distance between the material and sensing plate; or
   the size of the material's surface facing the sensing plate; or
   some combination thereof.

4. A level sensing printed circuit board according to claim 1, wherein the ground plane is configured to surround the sensing plate laterally and from behind to act as a barrier that nullifies the response from the sensing plate and cause the sensing plate to detect objects placed substantially in front of it.

5. A level sensing printed circuit board according to claim 1, wherein the signal processing module is configured to implement signal processing functionality related to implementations configured related to multiple sensing plates based at least partly on one input.

6. A level sensing printed circuit board according to claim 1, wherein the signal processing module is configured to distinguish between material types, so as to determine if the material is water or a part of a person in contact with the sensing plate.

7. A level sensing printed circuit board according to claim 1, wherein the signal processing module is configured to detect a non-conductive material, including plastic.

8. A level sensing printed circuit board according to claim 7, wherein the variable frequency oscillator comprises the comparator; the sensing capacitor is directly connected to an inverting input and ground, an output and the inverting input are connected through a resistor (RY); the non-inverting input is connected through three resistors, all having substantially the same value (RXa, RXb, RXc), to power (+V), ground and the comparator's output; and the comparator output is used as feedback for both inputs.

9. A level sensing printed circuit board according to claim 7, wherein the comparator is configured to operate as follows: when the comparator output is high, it generates a current that charges the sensing capacitor connected to the inverting input and a reference voltage applied to the non-inverting input, the value of the reference voltage is higher than the sensing capacitor's voltage when the comparator's output changes from low to high, as a result, the comparator output remains high until the sensing capacitor voltage reaches the reference voltage, at which point the comparator output changes from high to low; the low state generates a current that discharges the sensing capacitor connected to the inverting input and a different value for the reference voltage applied to the non-inverting input, the value of the reference voltage is lower than the sensing capacitor's voltage when the comparator's output changes from high to low, as a result, the comparator's output remains low until the sensing capacitor's voltage reaches the reference voltage, then the comparator's output changes from low to high and the cycle starts again.

10. A level sensing printed circuit board according to claim 1, wherein the signal processing module is configured to provide the corresponding signal as an output signal for turning on or off a pump based on a fluid level.

11. A level sensing printed circuit board according to claim 1, wherein the sensing capacitor is built using conductive strokes on the level sensing printed circuit board, comprising the variable frequency oscillator that provides the variable frequency oscillator signaling, and the signal processor module forms part of a microcontroller that comprises at least one memory and computer program code and at least one processor configured to perform the signal processing functionality for responding to the variable frequency oscillator signaling and determining the corresponding signal.

12. A level sensing printed circuit board according to claim 1, wherein the input is an inverting input of the comparator.

13. A level sensing printed circuit board according to claim 12, wherein the sensing capacitor is a stand alone capacitor coupled directly or indirectly to the level sensing printed circuit board, and the negative plate of the sensing capacitor is directly connected to the ground plane of the level sensing printed circuit board.

14. A level sensing printed circuit board according to claim 1, wherein the proportional frequency response is based at least partly on a change in a relationship between a value of the sensing capacitor and a frequency of the variable frequency oscillator.

15. A level sensing printed circuit board according to claim 1, wherein the signal processor module is configured to count pulses produced by the variable frequency oscillator during a constant time interval or time base, so the proximity of any material to the sensing plate is reflected as a reduction in the pulses counted so as to detect the material.

16. A level sensing printed circuit board according to claim 1, wherein the signal processing module is configured to detect the distance between the sensing plate and the material based at least partly on the fact that, if the type of material doesn't change, and the amount of sensing plate's surface facing the material remains substantially constant, then the frequency variation of a variable frequency oscillator coupled to the sensing plate will be inversely proportional to the distance between the material and the sensing plate.

17. A level sensing printed circuit board according to claim 1, wherein the signal processing module is configured to detect a fluid level and the size of a flat object facing the sensor plate based at least partly on the fact that, if the type of material doesn't change, and the distance between the material and the sensing plate remains substantially constant, then the frequency variation in a variable frequency oscillator coupled to the sensing plate is directly proportional to the amount of sensing plate's surface facing the material.

18. A level sensing printed circuit board according to claim 1, wherein the signal processing module is configured to detect different types of materials based at least partly on the fact that, if the distance between the material and the sensing plate remains substantially constant as well as the amount of sensing plate's surface facing the material, then the frequency change of a variable frequency oscillator coupled to the sensing plate will be directly proportional to the electrical conductivity of the material.

19. A level sensing printed circuit board according to claim 1, wherein the sensing plate is segmented into several discrete surfaces, each one with a well defined contribution to the net capacitance value but all them interconnected in a different printed circuit board layer, so that only one sensing plate can act as multiple virtual sensor surfaces, and so that the sensing plate need not be located on the same printed circuit board layer as the signal processing module and the variable frequency oscillator.

20. A level sensing printed circuit board according to claim 1, wherein the signal is provided from an output of the variable frequency oscillator.

21. A level sensing printed circuit board according to claim 1, wherein the signal processing module comprises:
at least one processor;
at least one memory including computer program code;
the at least one memory and computer program code configured to, with at least one processor, cause the signal processing module to implement the signal processing functionality for responding to the signal and determining the corresponding signal.

22. A level sensing printed circuit board according to claim 1, wherein the sensing capacitor forms part of the level sensing printed circuit board, and the negative plate of the sensing capacitor is directly connected to the ground plane of the level sensing printed circuit board.

23. A level sensing printed circuit board, comprising:
a variable frequency oscillator having a comparator with an inverting input, a non-inverting input and an output, having a sensing capacitor with a positive plate and a negative plate, and having resistors;
a sensing plate that corresponds to the positive plate of the sensing capacitor directly connected to the inverting input of the comparator of the variable frequency oscillator, and the negative plate of the sensing capacitor corresponding to a ground plane of the level sensing printed circuit board; and
a signal processing module configured at least to:
respond to a signal containing information about the electrical conductivity of a material causing a stimulus sensed by the sensing plate,
determine a corresponding signal containing information about a proportional frequency response caused by the stimulus and sensed by the sensing plate, based at least partly on the signal received, and
provide the corresponding signal as an output signal containing information about the proportional frequency response for turning on or off a pump.

24. A level sensing printed circuit board according to claim 23, wherein the level sensing printed circuit board comprises a ground plate that surrounds the sensing plate laterally and from behind.

25. A level sensing printed circuit board according to claim 23, wherein the signal contains information about a frequency variation that is proportional to the electrical conductivity of the material placed in front of the sensing plate, how much of the sensing plate's surface the material is facing, and the distance between the material and the sensing plate.

26. A level sensing printed circuit board according to claim 23, wherein the proportional frequency response contains information about at least one of the following:

the type of material in the proximity of the sensing plate; or the distance between the material and sensing plate; or the size of the material's surface facing the sensing plate.

27. A level sensing printed circuit board according to claim 23, wherein the signal processing module comprises:
at least one processor; and
at least one memory including computer program code;
the at least one memory and computer program code configured to, with at least one processor, cause the signal processing module to implement the signal processing functionality for responding to the signal, determining the corresponding signal, and provide the corresponding signal as the output signal.

28. A level sensing printed circuit board according to claim 23, wherein
the positive plate is coupled to the inverting input; and
the resistors comprise a first resistor coupled between the inverting input and the output, a second resistor coupled between the non-inverting input and the output; a third resistor coupled between a voltage source of the level sensing printed circuit board and the non-inverting input, and a fourth resistor coupled between the non-inverting input and the ground plate of the level sensing printed circuit board.

29. A pump, comprising:
a pump controller, configured to respond to a control signal and turn the pump on or off; and
a level sensing printed circuit board having
a sensing capacitor having a sensing plate and a negative plate, the sensing plate being a positive plate and configured to sense the electrical conductivity of a material causing a stimulus and provide positive plate signaling, and the negative plate corresponding to a ground plane of the level sensing printed circuit board,
a variable frequency oscillator having a comparator with an input configured to respond to the positive plate signaling, and provide variable frequency oscillator signaling containing information about variable frequency oscillations, based upon the positive plate signaling received, and
a signal processing module configured at least to:
respond to the variable frequency oscillator signaling,
determine a corresponding signal containing information about a proportional frequency response caused by the stimulus and sensed by the sensing plate, based at least partly on the signal received, and
provide the corresponding signal as the control signal containing information about the proportional frequency response for turning on or off a pump.

30. A pump according to claim 29, wherein the signal processing module comprises:
at least one processor; and
at least one memory including computer program code;
the at least one memory and computer program code configured to, with at least one processor, cause the signal processing module to implement the signal processing functionality for responding to the signal and determining the corresponding signal.

* * * * *